United States Patent
Sundquist et al.

(10) Patent No.: US 6,664,908 B2
(45) Date of Patent: Dec. 16, 2003

(54) SYNCHRONIZED PULSE WIDTH MODULATOR

(75) Inventors: Robert S. Sundquist, Paola, KS (US); John Belka, Shawnee, KS (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/230,646

(22) Filed: Aug. 29, 2002

(65) Prior Publication Data

US 2003/0058146 A1 Mar. 27, 2003

Related U.S. Application Data

(60) Provisional application No. 60/324,222, filed on Sep. 21, 2001.

(51) Int. Cl.[7] .............................................. H03M 3/00
(52) U.S. Cl. ..................... 341/143; 341/155; 341/156
(58) Field of Search ................................ 341/143, 155, 341/156, 164, 152, 131, 166

(56) References Cited

U.S. PATENT DOCUMENTS 4,968,987 A * 11/1990 Naka et al. ................. 341/143
5,068,659 A * 11/1991 Sakaguchi .................. 341/143
5,245,343 A * 9/1993 Greenwood et al. ........ 341/143
5,621,408 A * 4/1997 Cake et al. ................. 341/143

* cited by examiner

Primary Examiner—Brian Young
Assistant Examiner—John Nguyen

(57) ABSTRACT

A delta-sigma modulator for an analog-to-digital converter device and method for reducing a quantization error resulting from differences between the periods of the delta-sigma quantizer clock and the counter clock by using a pulse-width modulator in which the timing of the rising edge of each pulse is controlled by a relatively low-frequency clock signal, and the trailing edge of each pulse is controlled by the input analog signal level. Accordingly, the device and method are particularly effective for measuring the duty cycle of a pulse train from a delta-sigma analog-to-digital converter device when it is undesirable to run the high-frequency clock signal between the pulse-width modulator and the counter, for example when significant physical separation between the delta-sigma modulator and the counter.

23 Claims, 8 Drawing Sheets

SYNCHRONIZED PULSE WIDTH MODULATOR

This application claims the benefit of U.S. Provisional Application Serial No. 60/324,222, filed in the name of Bob Sundquist on Sep. 21, 2001, the complete disclosure of which is incorporated herein by reference.

FIELD OF THE INVENTION

The present invention relates to delta-sigma analog-to-digital converter devices and methods, and in particular to means for measuring the duty cycle of a delta-sigma analog-to-digital converter device.

BACKGROUND OF THE INVENTION

A device for converting an analog signal to a digital signal for processing by a digital computer is an analog-to-digital (A/D) converter that uses a pulse width modulator type quantizer, which produces a pulse train having a duty cycle that is proportional to the input analog signal level, followed by means to measure the duty cycle over some time period of interest. A known method for implementing a pulse width modulator is the delta-sigma ($\Delta$-$\Sigma$) quantizer, detailed in FIG. 3 and discussed below.

Delta-sigma analog-to-digital ($\Delta$-$\Sigma$ A/D) converters are a class of A/D converters characterized by use of the extremely simple $\Delta$-$\Sigma$ quantizer design. The quantizer within a $\Delta$-$\Sigma$ A/D converter provides an output signal having only one bit of resolution. To achieve higher resolutions, many sequential output samples from the quantizer are averaged or processed by other digital means. The primary advantage of $\Delta$-$\Sigma$ A/D converters is their analog simplicity which makes them exceptionally linear, small, and insensitive to component tolerance variations so that they are easy to integrate within a mostly digital integrated circuit.

Prior art $\Delta$-$\Sigma$ A/D converters are characterized by feeding a source of analog information into a $\Delta$-$\Sigma$ A/D quantizer that converts the analog data into a "density" modulated serial digital data stream, and subsequent digital signal processing of that data to arrive at a meaningful output. The $\Delta$-$\Sigma$ A/D quantizer includes one or more stages of analog integration, which corresponds to the "order" of the quantizer. This is followed by a digital delay stage, typically, a latch, which provides the output from the quantizer as well as a portion of the feedback signal for the quantizer.

FIG. 1 is a block diagram of a generic prior art $\Delta$-$\Sigma$ A/D converter implementation at a system level. The analog input signal that is applied to input terminal 1 of the $\Delta$-$\Sigma$ A/D converter consists of both AC and DC components. A $\Delta$-$\Sigma$ quantizer 3 receiving the analog input signal may be of any order and may possess either a conventional linear or non-linear (as in high information delta modulation "HIDM" and adaptive delta modulation) transfer function, wherein the order is defined as the number of integrators embedded within the $\Delta$-$\Sigma$ A/D quantizer block 3. The output of the $\Delta$-$\Sigma$ A/D quantizer is shown on line 5 as a 1-bit serial digital data stream having an output that is substantially "density" modulated and is proportional to the product of the input signal at 1 and the transfer function operated by the $\Delta$-$\Sigma$ A/D quantizer 3.

The output 5 of the quantizer 3 in prior art $\Delta$-$\Sigma$ A/D converters has been processed in a number of ways, including decimation, averaging, and digital filtering to arrive at a usable signal. These methods have been used in various combinations and have been combined with weighting of the decimated samples and dithering to improve the resolution attainable (and hence the ultimately realizable accuracy and signal-to-noise ratio) and conversion speed. As illustrated in FIG. 1, the output 5 of the $\Delta$-$\Sigma$ A/D quantizer block 3 is accordingly input to a signal processing stage 7 that may include a decimation block 9, a weighting block 11, and one or both of a digital finite impulse response (FIR) filter 13 and infinite impulse response (IIR) filters 15 to reduce the raw $\Delta$-$\Sigma$ A/D quantizer's serial output data to produce a high resolution output on line 17. Although there are many advantages to implementing the $\Delta$-$\Sigma$ A/D conversion process over more conventional A/D conversion processes, such as flash and successive approximation, many of the prior art methods of $\Delta$-$\Sigma$ A/D conversion unfortunately suffer from a much longer data latency than can be tolerated in many applications, most notably in control systems.

FIG. 2 illustrates waveforms typical of those produced by the prior art $\Delta$-$\Sigma$ A/D quantizer block 3 when a sinusoidal analog signal is applied to input terminal 1 and a high frequency clock is applied to a digital delay on input line 19, as discussed in FIG. 3. As the analog input signal represented as waveform 21 changes, the duty cycle of the pulse train from the $\Delta$-$\Sigma$ A/D quantizer block 3, i.e., the duty cycle of the "Q" output from D-flip-flop shown at 22 in FIG. 3, which is represented in FIG. 2 as waveform 23, follows the input waveform 21. As shown by the portion of the pulse train enclosed by bracket 25, the $\Delta$-$\Sigma$ A/D quantizer's serial output data on line 5 has a low short-term duty cycle over the interval, whereby it matches the sinusoidal input waveform 21, which is shown just below the bracketed portion 25, while the short-term duty cycle is higher over the bracketed interval 27, whereby it again matches the input waveform 21.

As set forth in the heretofore published literature, the output data from prior art $\Delta$-$\Sigma$ A/D quantizer has been processed in several different ways. The attempt of all these known methods has been to reduce the raw $\Delta$-$\Sigma$ A/D quantizer's serial output data in a manner which can discern the finest incremental step size in the shortest period of time at point 17 in FIG. 1. In telecommunications parlance, this equates to maximizing the frequency response and dynamic range of the conversion process while maintaining a given minimum signal-to-noise ratio.

The methods by which such output data has been manipulated to achieve these goals are summarized here. Averaging over time is the simplest method for reducing the output bit stream from a $\Delta$-$\Sigma$ A/D quantizer. Accordingly, the number of HIGH or "1" states (see FIG. 2, number 29) of the $\Delta$-$\Sigma$ A/D output waveform 23 are "counted" during a fixed measurement interval or time period, such as interval 31. A ratio of the total time spent in the "1" state to the fixed measurement interval 31 equates to the average duty cycle measured over that interval. The resolution of this method is limited to 1/d, where d is the number of clock cycles 33 contained within the fixed interval 31.

Increasing the measurement period 31 and increasing the ratio of measurement time to clock period to improve resolution results in a correspondingly longer net conversion time, which worsens latency. Increasing the clock frequency (waveform 33) to improve the resolution is limited by the performance of an integrator portion of the $\Delta$-$\Sigma$ A/D quantizer. Other secondary effects due to parasitic circuit elements also appear as the clock rate is increased.

A running average method for reducing the output bit stream from the $\Delta$-$\Sigma$ A/D quantizer adds many low resolution measurements together. This method concatenates together many contiguous lower resolution measurements to produce data that is similar to an average-over-time measurement, as described above, having an equal overall period.

The running average method can be combined with a small dither signal 35, as illustrated in FIG. 1, that is input through a mixer 37 to the basic average-over-time data reduction scheme described above. This method improves the resolution, but the dither must be filtered out.

The running average method can also be combined with a digital filter, which has been widely used to reduce the output data 5 from the Δ-Σ A/D quantizer 3. The digital filter following the running average reduces both the duty cycle or "density" and inter-bit phasing information contained in the Δ-Σ quantizer output 5 in order to achieve an output on line 17 having a given precision and minimal latency, as compared to the previously mentioned prior art methods. This method is commonly implemented as multiple stages of accumulation combined with decimation at block 9 and one or both of the digital FIR filter 13 and the IIR filters 15 within the signal processing block 7. This method has the advantage of providing very high resolution; however, the latency, i.e., time delay, of the output data at 17 from the analog input stimulus at "1" can be excessive for control systems applications. This long latency can be overcome by shortening the filter functions, particularly the typically long latency FIR block 13; but this degrades resolution, and, hence, the signal-to-noise ratio. Alternatively, the frequency of the Δ-Σ quantizer can be increased, but this reaches hardware limitations, as described above in the average-over-time measurement method. The running average and digital filtering method is often combined with multiplying each input to the digital FIR filter 13 by a time-varying weighting coefficient as represented by block 11. This weighting is a multiplicative process, in contrast to the analog "dither" method, which is an additive process.

U.S. Pat. No. 5,245,343, entitled Enhanced Accuracy Delta-Sigma A/D Converter, which is assigned to the assignee of the present application and is incorporated in its entirety herein by reference, provides an adaptive window-based decimation cycle whose exact timing is data dependent. The adaptive windowing process is implemented in a microprocessor-based signal processor and allows the first occurrence of a proper polarity state transition occurring during a window period to become the termination point of the computation cycle, rather than providing a fixed time interval. By doing so, the effective resolution is increased by an order of magnitude for a predetermined duty cycle.

As described by U.S. Pat. No 5,245,343, the Δ-Σ A/D quantizer 3 of the prior art typically includes a first operational amplifier having the analog input to be converted applied to either its non-inverting input or its inverting input and a reference voltage applied to the second input. A feedback capacitor couples the output of this operational amplifier back to the input having the analog input such that the combination functions as an analog integrator. The output of the integrator circuit is effectively coupled to the data input of a D-flip flop which is clocked at a predetermined rate. When the output from the integrator exceeds the threshold established for the D-input of the flip-flop, a logical "1" output will appear at its output terminal at the time that a clock signal is applied to the clock input of that flip-flop. The output from the flip-flop is a serial digital data output stream that is also effectively applied to the second input of the op-amp integrator.

FIG. 3 illustrates a simple, first-order linear Δ-Σ A/D quantizer 3 of a type well-known in the prior art. The Δ-Σ A/D quantizer 3 receives an analog input signal from a source 39 of analog information to an integrator 41 formed of an operational amplifier 43 and a feedback capacitor 45. The integrator circuit 41 is configured for operation either in an inverting mode or in a non-inverting mode (shown) having the analog input to be converted applied to its inverting input and a reference voltage $V_{REF}$ applied its non-inverting input. High and low reference voltages V+ and V− are coupled through a feedback resistor 47 to the non-inverting input of the operational amplifier 43. An electronic switch 49 is provided for switching the feedback resistor 47 between the two reference potentials V+ and V−. A comparator 51 is coupled to receive the output of the integrator circuit 41 to provide threshold detection capability. The comparator 51 may be either a real component as illustrated or a "pseudo" component where its function is implemented by the input switching threshold of the data input "D" to the D flip-flop 53 controlled by a high frequency clock signal applied to the clock input on input line 19 and functioning as a digital delay.

As described by U.S. Pat. No. 5,245,343, an additional D flip-flop latch 55 may be included to form a multi-stage shift register 57, operating as a digital delay line in the circuit, coupled to receive as its input the output from the integrator circuit 41. The serial digital output signal train from the shift register is fed back to the input of the integrator circuit 41 and because of the frequency division which takes place, for a given high clock rate, the operational amplifier 43 may be of type having a lower gain/bandwidth product than in other prior art circuits.

FIG. 4 is a plot of signal waveforms over time at various points in the circuit for the case of the single clocked digital delay feed back to the integration phase, wherein the Δ-Σ A/D quantizer circuit includes only the single D flip-flop latch 53 for receiving the output from the integrator circuit 41. The clock waveform is shown at 59. The output of the flip-flop is shown on line 61 and the output of the integration stage is shown on line 63. Transitions of the flip-flop output signal 61 occur simultaneous with rising edges of clock signal 59. The slewing behavior of waveform 63 can be considered the base line for the prior art of the type having a single D flip-flop 53 in the Δ-Σ A/D quantizer circuit. The signal processor 7 takes the serial data output signal 61 of the single latch 53 and determines the digital form of the analog input signal.

FIG. 5 shows plots of signal waveforms over time at various points in the circuit for the case of the single clocked digital delay feed back to the integration phase, wherein the Δ-Σ A/D quantizer circuit includes the multi-stage shift register 57 coupled to receive as its input the output from the integrator circuit 41. Digital signal waveform 65 represents the system clock, which is applied to the clock terminal 41 of the latches 53, 55 of the multi-stage shift register 57. The system clock is shown as having a 50% duty cycle clock. A second waveform 67 on the graph of FIG. 5 represents the output of the downstream latch 55 on line 45. The output of the latch switches between the "0" and "1" states in response to the output of the integrator 41. Triangular waveform 69 represents the integrator output which is slewing in a triangular waveform in response to the input to the integrator circuit 41 on line 46, the feedback of the capacitor 49 and the operation of the multi-stage shift register 57. The signal processor 7 reads the serial output data signal 67 for determining the digital form of the analog input signal.

As illustrated in FIG. 5, during the high output of the latch 55, the integrator 41 is discharging until such time that the latch 55 changes state to a "0" and the integrator starts charging. As the analog input signal increases, the duration of time that the latch is at a "0" state also increases. When the input signal is at a maximum value, the output of the latch is maintained at a "0" state for the longest period. During the middle of the swing of the sinusoidal input signal, the output of the latch is in the "0" state and the "1" state an equal amount of time.

Thus, when the pulse width modulator is implemented as one of the Δ-Σ modulators shown in FIG. 3, the input analog signal level, $V_{IN}$, is approximated by measuring the duty cycle over a sampling interval, Ts, where the sampling interval begins and ends on a clock transition (CLK). In other words, the signal processor must be able to count the number of highs for any sample period and calculate the duty cycle during a sample window.

An important characteristic of any means for converting an analog signal to a digital signal is the quantization error, which is the difference between the input analog signal and its digital representation. Since a digital signal can only take discrete values and an analog signal can take any value along a continuum, a quantization error is always present in the conversion process. When the Δ-Σ modulator circuit is used as shown in FIG. 3, the quantization error, assuming ideal components, is given by:

$$Q_1 = \frac{(V^+ - V^-)T_{CLK}}{2\sqrt{3}\,T_S}$$

$$q_1 = \frac{Q}{V^+ - V^-} = \frac{T_{CLK}}{2\sqrt{3}\,T_S}$$

where $T_{CLK}$ is the time between clock transitions.

Measuring the duty cycle as described above can be accomplished by a counter for counting the number of highs and lows during any sample period. The counter is connected to the output of the Δ-Σ modulator circuit shown in FIG. 3 and is clocked with the same clock signal CLK; the counter is then sampled by the processor at the end of each sampling interval, $T_S$. This method requires the same clock signal to be available both at the Δ-Σ modulator and at the counter to coordinate the counter with the sampling interval.

SUMMARY OF THE INVENTION

Accordingly, the devices and methods of the present invention reduce the quantization error resulting from differences between the periods of the Δ-Σ quantizer clock $T_{CLK1}$ and the counter clock $T_{CLK2}$ by using a pulse-width modulator in which the timing of the rising edge of each pulse is controlled by a relatively low-frequency clock signal, and the trailing edge of each pulse is controlled by the input analog signal level. Accordingly, the circuit of the present invention is particularly effective for measuring the duty cycle of a pulse train from a Δ-Σ A/D converter device when it is undesirable to run the high-frequency clock signal between the pulse-width modulator and the counter, for example when significant physical separation between the Δ-Σ modulator and the counter.

The invention is embodied by example and without limitation in a pulse-width modulator device that is illustrated in FIG. 7.

According to one aspect of the invention, the invention provides a delta-sigma modulator for an analog-to-digital converter for converting an analog voltage signal to a digital output signal, the delta-sigma modulator having an input for receiving the analog voltage signal; a first clock generator for generating a first clock signal at a first frequency; a pulse-width modulator-type quantizer that is responsive to an input analog voltage signal and to the first clock signal for producing a pulse train having a duty cycle that is proportional to the analog voltage signal level; a second clock generator for generating a second clock signal at a second frequency; a measuring mechanism that is responsive to the second clock signal for measuring the duty cycle of the pulse train over a sampling interval and outputting a density modulated serial digital data stream; and a signal processing stage for digitally processing the density modulated serial digital data and producing a digital output signal corresponding to the analog voltage signal.

According to another aspect of the invention, the pulse train output by the pulse-width modulator-type quantizer also has a plurality of pulses each having a rising edge and a trailing edge, timing of the rising edge of each pulse being controlled by the first clock signal and timing of the trailing edge of each pulse being controlled by the analog input signal level.

According to another aspect of the invention, the frequency of the first clock signal is selected to be a submultiple of the frequency of the second clock signal.

According to another aspect of the invention, the signal processing stage of the invention is responsive to a third clock signal for timing the sampling interval over which the measuring mechanism measures the duty cycle of the pulse train, the third clock signal being generated at a third frequency that is a submultiple of the frequency of the first clock signal.

According to another aspect of the invention, the measuring mechanism is an asynchronous counter mechanism.

According to still other aspects of the invention, the invention provides a delta-sigma modulator for an analog-to-digital converter, including: (a) a source of time-varying analog signals; (b) a switch circuit having two reference input terminals, a control terminal, and an output terminal, such that the output terminal is connected to one of the input terminals based on the logic state of the control terminal; (c) a signal integrating circuit having an input terminal and an output terminal, the source of analog signals being coupled to the input terminal and producing at the output terminal a changing output signal proportional to the integral of the analog signals; (d) a clocked resettable D flip-flop circuit having a clock input terminal, a reset input terminal and an output terminal, the reset input terminal of the flip-flop circuit being connected to the output terminal of the signal integrating circuit, the flip-flop circuit being structured to change state as a function of a charge state of the integrating circuit; i.e., the flip-flop circuit is structured to change to the logic "0" whenever the signal input terminal is in the logic "1" state, and to change to the logic "1" state synchronous with a rising edge on the clock input terminal if the signal input terminal is in the logic "0" state; (e) a single feedback path coupling the output terminal of the flip-flop circuit to the control terminal of the switch circuit; (f) a counter circuit having a clock input terminal, a signal input terminal and an output terminal, the signal input terminal of the counter circuit being connected to the output terminal of the D flip-flop circuit for counting a quantity of state changes of the D flip-flop circuit during a sampling period; and (g) means for applying a plurality of different regularly occurring clock pulses to each of the clock input terminals of the D flip-flop circuit and the counter circuit, the clock pulse being applied to the counter circuit having a period that is a submultiple of a period of the clock pulse being applied to the D flip-flop circuit, and the period of the clock pulse being applied to the D flip-flop circuit being a submultiple of the sampling period.

According to another aspect of the invention, wherein the signal integrating circuit is a first-order signal integrating circuit, the clocked flip-flop circuit is a single D flip-flop latch, and the counter circuit is an asynchronous counter circuit.

According to another aspect of the invention, wherein the delta-sigma modulator also includes a signal processor circuit having a signal input terminal and an output terminal, the signal input terminal of the signal processor circuit being connected to the output terminal of the counter circuit for sampling an output of the counter circuit at an end of each sample period.

According to yet other aspects of the invention, the invention includes methods for using an electronic circuit to convert an analog input signal to a digital output signal, one of the methods including: (a) receiving an analog input signal a source of time varying analog signals; (b) with the electronic circuit, receiving first and second clock signals at different frequencies, the frequency of the first clock signal being a submultiple of the frequency of the second clock signal; (c) with the electronic circuit, in response to the first clock signal using a delta-sigma modulation-type quantizer circuit for quantizing the analog input signal; and (d) with the electronic circuit, in response to the second clock signal, counting a number of highs occurring during a sample period.

According to another aspect of the method of the invention, the first clock signal is a submultiple of the sampling period.

According to another aspect of the method of the invention, quantizing the analog input signal includes producing a pulse train having a duty cycle that is proportional to the analog input signal level.

According to another aspect of the method of the invention, counting a number of highs occurring during a sample period includes measuring the duty cycle of the pulse train over the sample period.

According to another aspect of the invention, the method of the invention includes, with the electronic circuit, generating the first and second clock signals, and synchronizing the second clock signal with the first clock signal.

According to another aspect of the invention, the counting portion of the method of the invention includes, with the electronic circuit, outputting a signal representative of the number of highs counted during the sample period, and processing the signal representative of the number of highs counted during the sample period for converting the received analog input signal to a digital output signal.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

Figure 1:
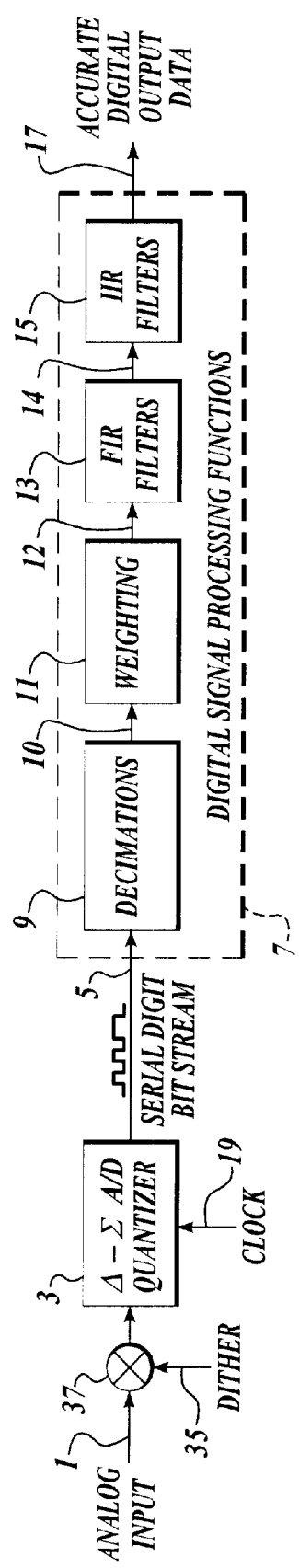
FIG. 1 is a system level block diagram of a generic Δ-Σ A/D converter implementation of the prior art having an analog signal consisting of both AC and DC components applied to the input terminal of the Δ-Σ A/D converter.
Figure 2:
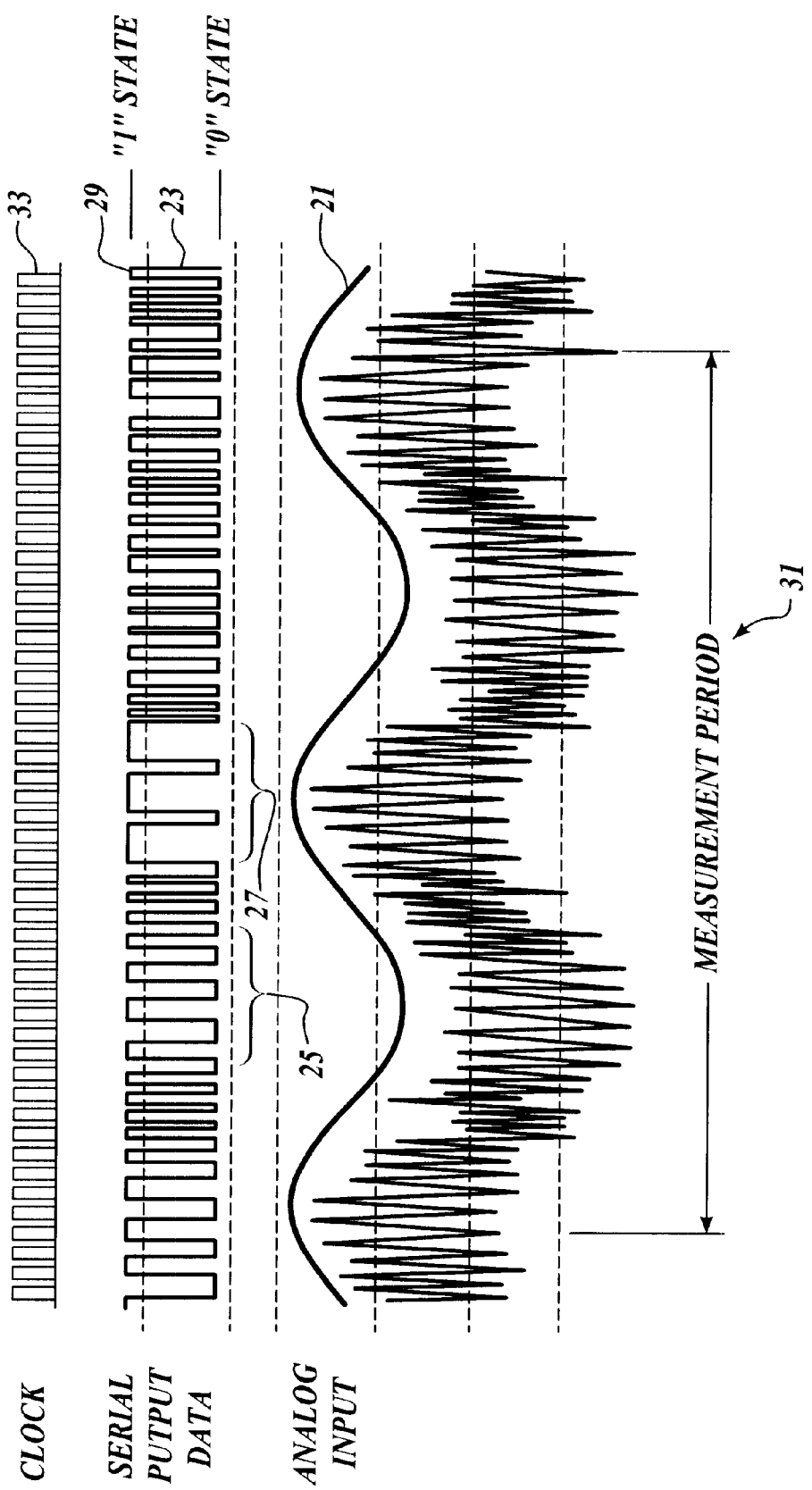
FIG. 2 illustrates waveforms typical of those produced by the prior art Δ-Σ A/D converter implementation when a sinusoidal analog signal is applied to an input thereof and a high frequency clock is applied to a digital delay of a first-order linear Δ-Σ A/D quantizer portion.
Figure 3:
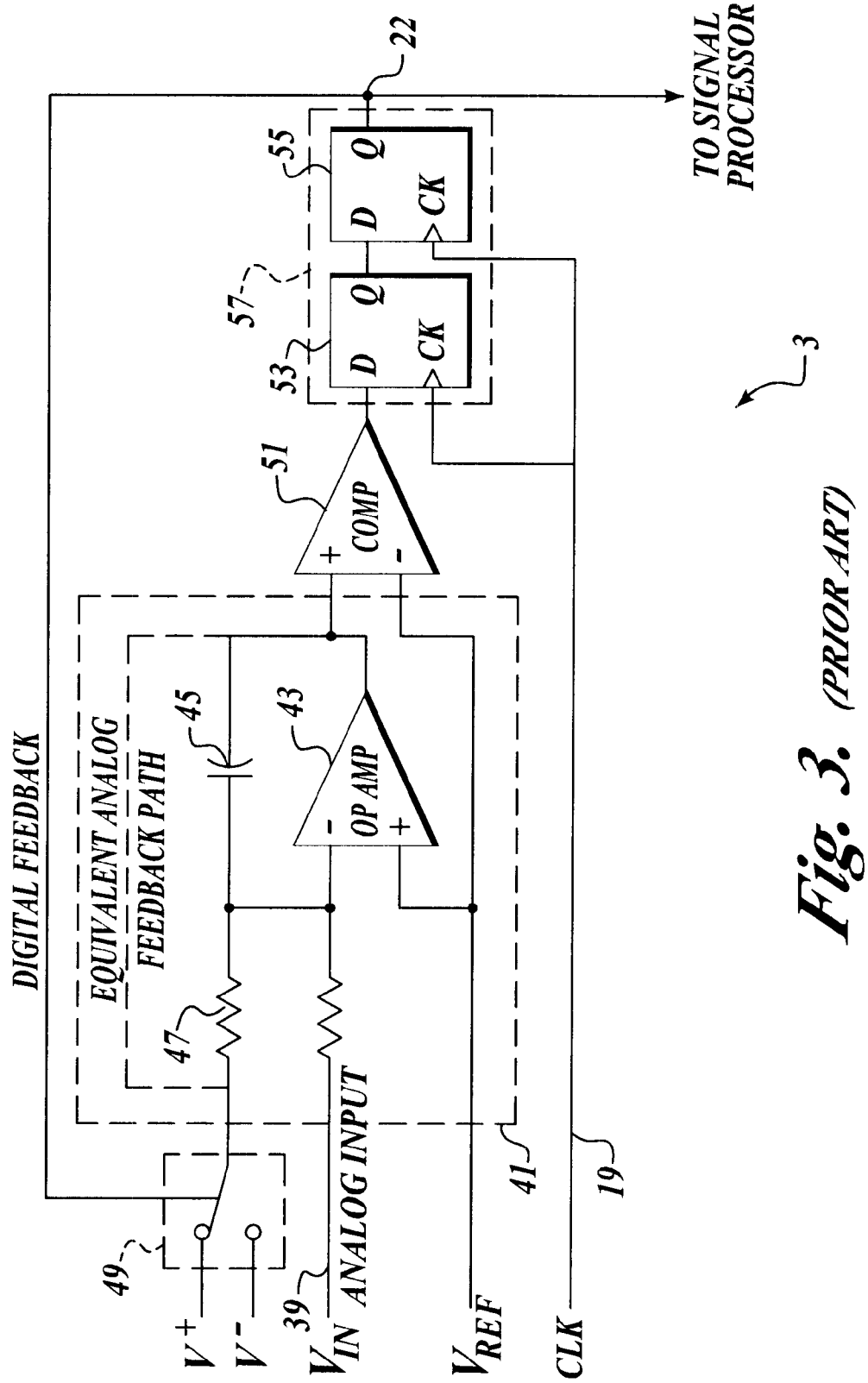
FIG. 3 is a block diagram of a simple, first-order linear Δ-Σ A/D quantizer implementation of the prior art.
Figure 4:
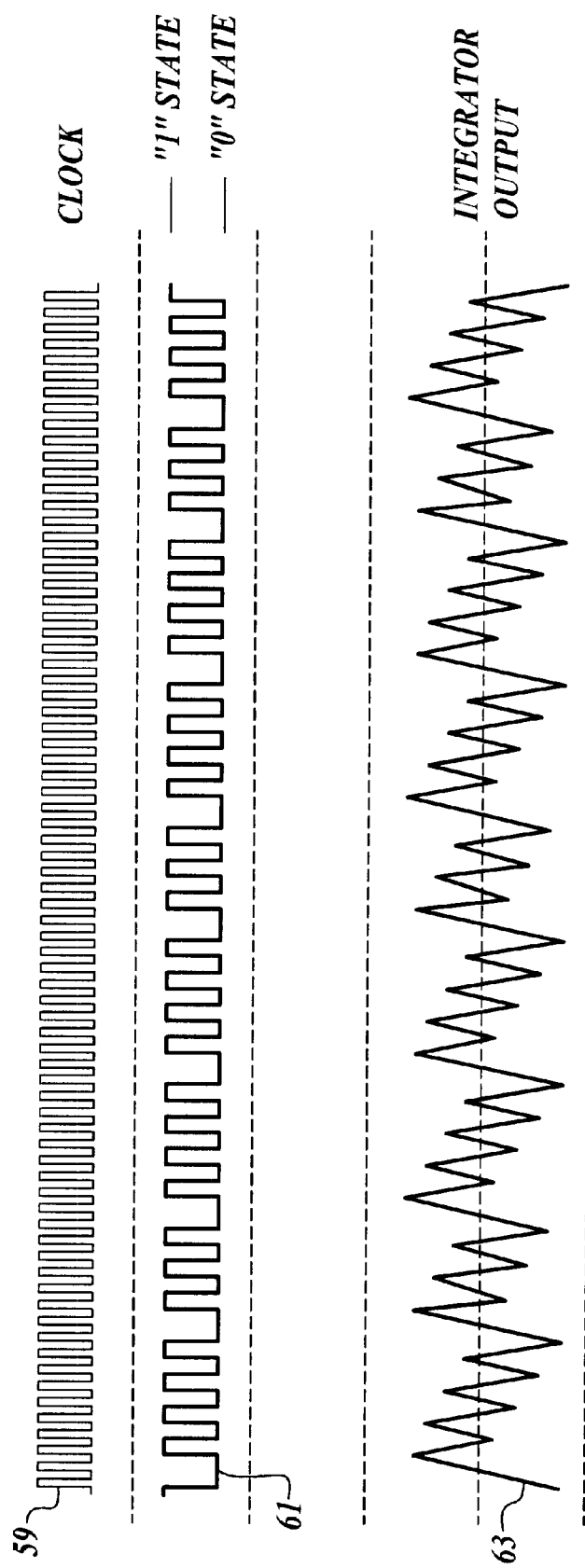
FIG. 4 shows plots of signal waveforms over time at various points in the circuit diagramed in FIG. 3 for the case of a single clocked digital delay feed back to an integration phase of the circuit, wherein the Δ-Σ A/D quantizer circuit includes only a single D flip-flop latch for receiving the output from an integrator circuit portion.
Figure 5:
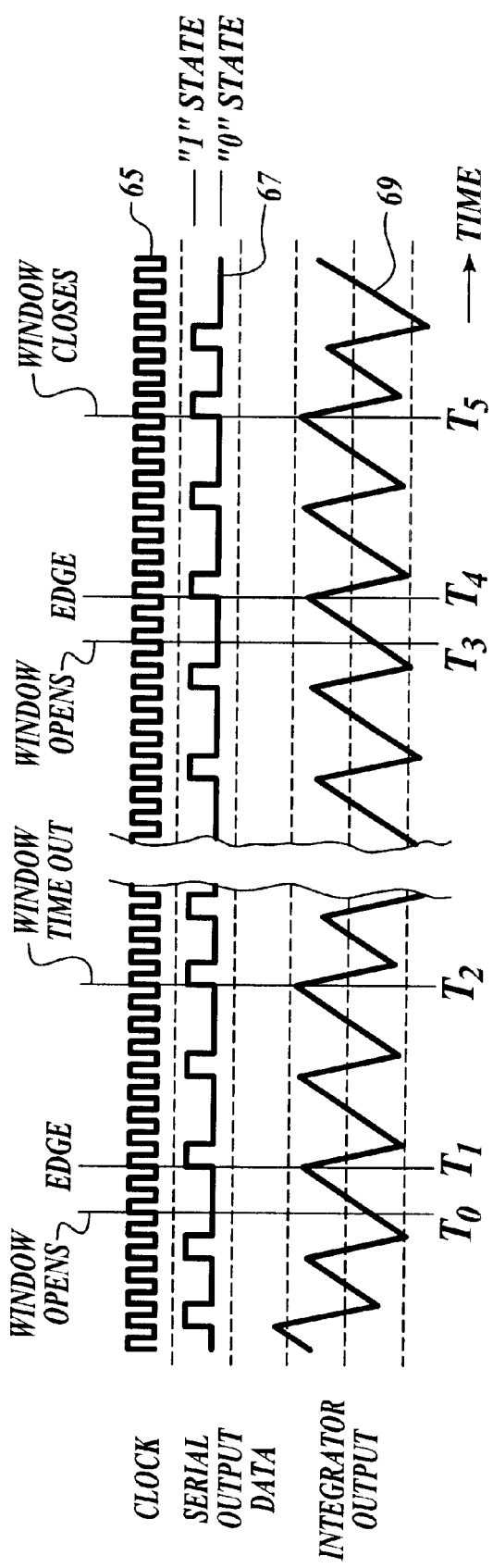
FIG. 5 shows plots of signal waveforms over time at various points in the circuit diagramed in FIG. 3 for the case of a single clocked digital delay feed back to the integration phase of the circuit, wherein the Δ-Σ A/D quantizer circuit includes a multi-stage shift register coupled to receive as its input the output from the integrator circuit portion.

The present invention is an apparatus and method for measuring the duty cycle of a delta-sigma analog-to-digital (Δ-Σ A/D) converter device by connecting a counter to the output of the Δ-Σ modulator circuit shown in FIG. 3. The counter is sampled by the processor at the end of each sampling interval, $T_S$. This method has been known in prior art devices. However, in prior art devices the counter must be clocked with the same clock signal CLK. Thus, prior art devices embodying this method have required that the same clock signal be available both at the Δ-Σ modulator and at the counter to coordinate the counter with the sampling interval. If a significant physical separation exists between the Δ-Σ modulator and the counter, issues regarding control of radiated interference may make it undesirable to run the high-frequency clock signal between these separated two points.

Figure 6:
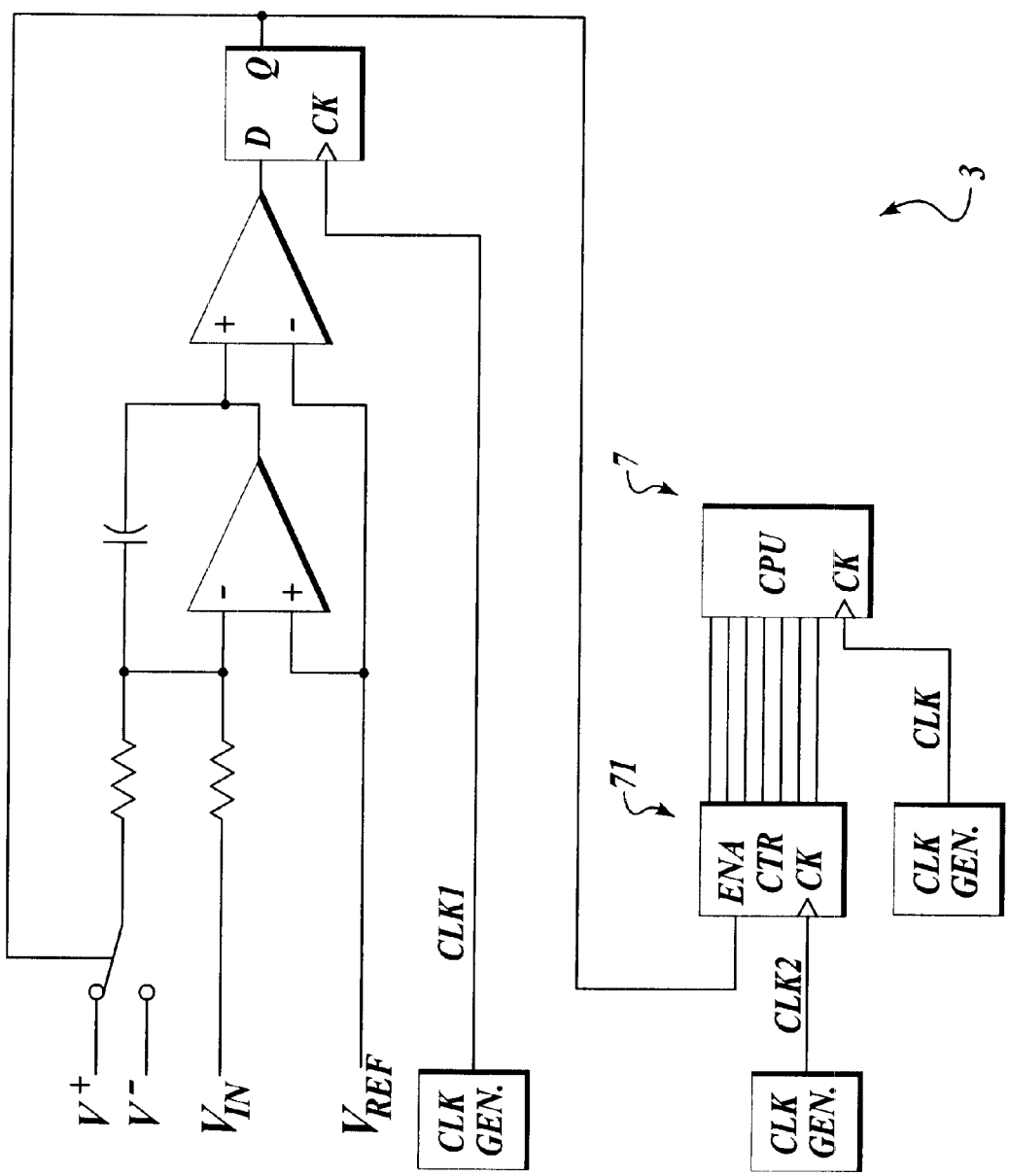
FIG. 6 illustrates one known means for measuring the duty cycle of the prior art Δ-Σ modulators diagramed in FIG. 3, wherein a significant physical separation exists between the Δ-Σ A/D quantizer circuit and a signal processor.

FIG. 6 illustrates one known means for measuring the duty cycle as described above in connection with the prior art Δ-Σ modulators shown in FIG. 3 wherein a significant physical separation exists between the Δ-Σ modulator and the counter. In FIG. 6 an asynchronous counter 71 is connected between the output of the above Δ-Σ quantizer circuit 3 and the processor 7. Because it undesirable to run the high-frequency clock signal between the widely separated quantizer circuit and counter, the Δ-Σ quantizer circuit 3 is clocked with a first clock signal CLK1, while the counter 71 is clocked with a second clock signal CLK2. The counter 71 is sampled by the processor 7 at the end of each sampling interval, $T_S$. However, when the asynchronous counter 71 is being clocked by a different clock from the quantizer, as shown in FIG. 6, an additional quantization error is introduced. For example, if the period of the counter clock, $T_{CLK2}$, is shorter than period of the Δ-Σ quantizer clock $T_{CLK1}$, a quantization error is associated with the beginning and end of the high time of each pulse, the quantization error having a range $\pm\frac{1}{2}T_{CLK1}$ and with a standard deviation equal to $$\frac{T_{CLK2}}{2\sqrt{3}}.$$

If the average pulse width is given as $T_P$, the standard deviation of the accumulated quantization error over one sample period of the processor, $T_S$, is given by:

$$Q_2 = \frac{T_{CLK2}\sqrt{T_S}}{\sqrt{6T_P}}.$$

The standard deviation $Q_2$ can be normalized to the full-scale range of the Δ-Σ A/D converter as:

$$q_2 = \frac{Q_2}{T_S} = \frac{T_{CLK2}}{\sqrt{6T_P T_S}}.$$

The quantization error is root-sum-squared with the standard deviation of the previous quantization error as:

$$q = \sqrt{q_1^2 + q_2^2} + \sqrt{\frac{T_{CLK1}^2}{12T_S} + \frac{T_{CLK2}^2}{6T_P T_S}}.$$

The relationship between $T_{CLK1}$, and $T_P$ depends on the input, $V_{IN}$. The relationship can also be controlled to some extent by insertion of a digital delay line in place of the single flip-flop, as described by Greenwood and DuPuis in U.S. Pat. No. 5,245,343. Thus, setting $T_P$ to a large value while maintaining a small value for $T_{CLK1}$, so that the first term does not get too large, requires the cost of a large shift register.

Figure 7:
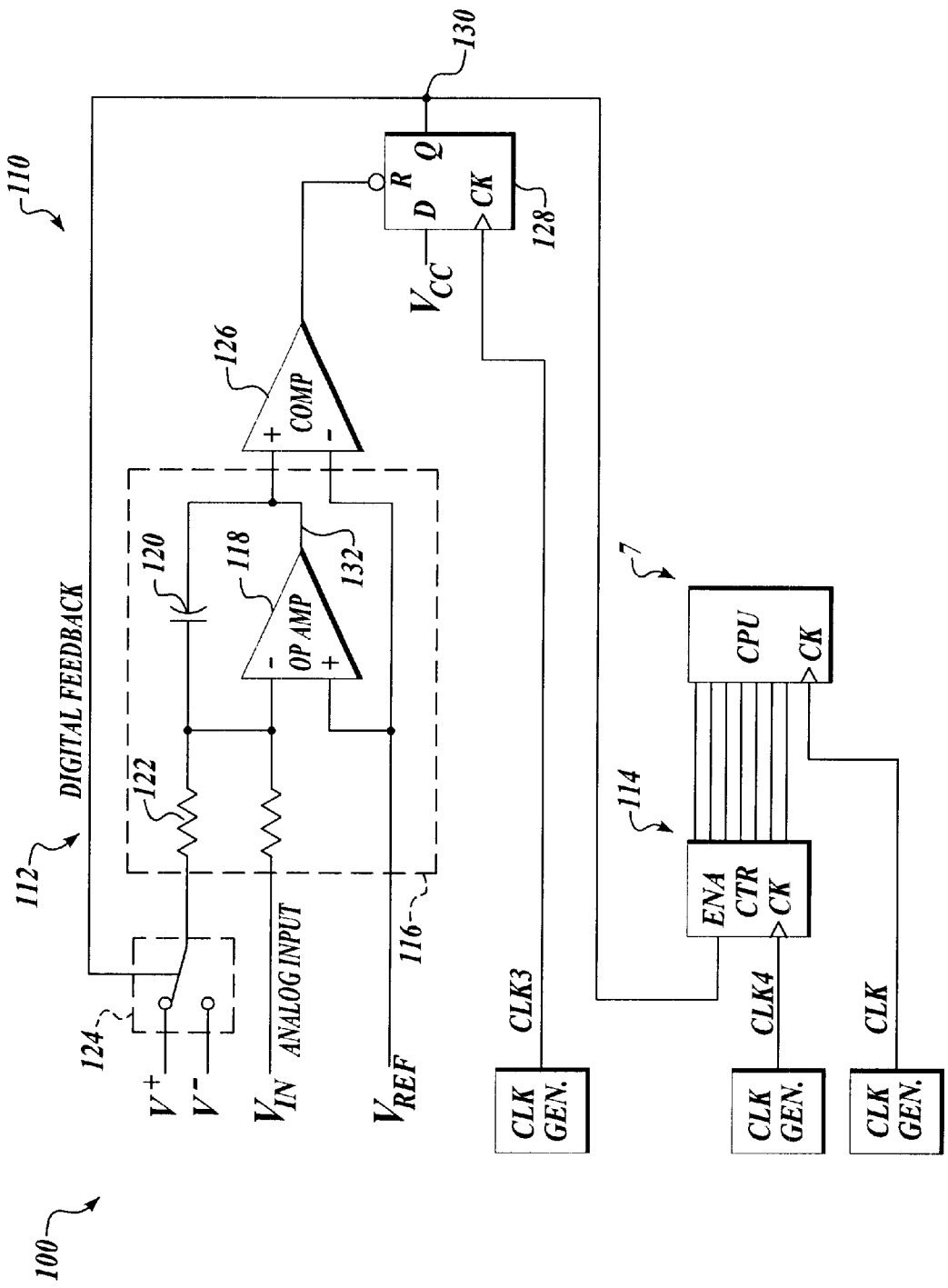
FIG. 7 illustrates the method and device of the present invention embodied in a Δ-Σ A/D converter device having a Δ-Σ A/D quantizer structured for converting input analog data into a density modulated serial digital data stream, and a digital processor for subsequent digital processing of the density modulated serial digital data to arrive at a meaningful output.

According to the present invention, the quantization error resulting from differences between the periods of the Δ-Σ quantizer clock $T_{CLK1}$ and the counter clock $T_{CLK2}$ can be reduced by using a pulse-width modulator in which the timing of the rising edge of each pulse is controlled by a relatively low-frequency clock signal, and the trailing edge of each pulse is controlled by the input analog signal level. The invention is embodied in such a pulse-width modulator as is illustrated in FIG. 7. Accordingly, the circuit of the present invention is particularly effective for measuring the duty cycle of a pulse train from a Δ-Σ A/D converter device when it is undesirable to run the high-frequency clock signal between the pulse-width modulator and the counter, for example when significant physical separation between the Δ-Σ modulator and the counter.

FIG. 7 illustrates by example and without limitation the method and device of the present invention embodied in an over sampled A/D converter device 100 in a Δ-Σ configuration. The Δ-Σ A/D converter device 100 includes a Δ-Σ A/D modulation-type quantizer 110 structured for converting input analog data into a density modulated serial digital data stream, and a digital processor 7 for subsequent digital processing of the density modulated serial digital data to arrive at a meaningful output. The Δ-Σ A/D quantizer 110 includes a pulse-width modulation-type Δ-Σ quantizer 112 for generating a pulse train having a duty cycle that is proportional to the input analog signal level, and a time-based counting mechanism 114 such as an asynchronous counter for measuring the duty cycle over the sampling interval $T_S$ of the processor 7. The digital processor 7 is of a form well-known in the prior art and described in detail above.

In FIG. 7 the Δ-Σ A/D quantizer 110 is structured to receive an analog input signal from a source $V_{IN}$ of analog information to the Δ-Σ quantizer 112 for quantizing the analog input signal in response to an external clock signal CLK3. The Δ-Σ quantizer 112 receives the analog signal to be quantized at the input to an analog integrating function, which is generated by an integrator circuit 116 that is of a form well-known in the prior art and described in detail above. For example, the integrator circuit 116 includes an operational amplifier 118 and a feedback capacitor 120 and may be configured either in an inverting mode or a non-inverting mode (shown) having the analog input source $V_{IN}$ applied to its inverting input and the reference voltage $V_{REF}$ applied its non-inverting input. High and low reference potentials V+ and V− are coupled through a feedback resistor 122 to the non-inverting input of the operational amplifier 118. An electronic switch means 124 is provided for switching the feedback resistor 122 between the two reference potentials V+ and V− under the control of a digital feedback signal. A comparator 126 is coupled to receive the output of the integrator circuit 116 to provide threshold detection capability.

In contrast to conventional Δ-Σ quantizers in which the output of the comparator is coupled to the data input "D" of the flip-flop, in the Δ-Σ quantizer 112 of the invention the output of the comparator 126 is coupled to a negative logic reset input "R" of a D flip-flop circuit 128. The data input "D" is coupled to logic HIGH, which is implemented as a collector-voltage supply $V_{CC}$. In operation, the pulse generated by the flip-flop 128 will go HIGH synchronous with the external clock signal CLK3, and will go LOW as a function of the analog input $V_{IN}$. This operation produces a pulse-width modulated signal of a controlled frequency having one edge that is synchronized to an external low-frequency clock. The serial digital output signal train 130 at the Q output of the clocked flip-flop 128 is coupled to enable the counter 114.

The serial digital output signal Q of the clocked flip-flop 128 is also added to the feedback of the integrating capacitor 120 via the electronic switch 124. However, the flip-flop circuit 128 that produces the digital feedback signal 130 is a device designed for digital applications, and such devices do not usually produce an output having sufficient signal level accuracy and stability for use in the Δ-Σ A/D converter device 100 as embodied in FIG. 7. The switch 124 thus provides precise control of the reference levels, and also provides design flexibility by allowing selection of the reference voltages V+ and V− appropriate for an expected range of the analog signal $V_{IN}$ to be quantized. The electronic switch 124 outputs one of the reference voltages, either V+ or V−, to the integrator circuit 116 as a function of the digital feedback signal 130 applied to the switch control input. The digital feedback signal 130 thus drives the electronic switch 124 to output a signal that is integrated to produce a value proportional to the duty cycle of the control input signal. According to one embodiment of the invention, the electronic switch 124 is eliminated and the digital feedback signal 130 is fed directly into the integrator circuit 116. The output of the integrator circuit 116 is thus effectively coupled to the "R" input of a D flip-flop circuit.

The comparator 126 may be either a real component, as illustrated, or a "pseudo" component, as discussed above.

The converter 100 includes a clock generator for generating a relatively low-frequency clock signal CLK3 that clocks the entire quantizer system at a predetermined sampling rate with a sampling clock signal at the clock terminal CK of the flip-flop 128. As is conventional for Δ-Σ modulator circuits, the clock signal CLK3 input to the flip-flop 128 operates at a frequency which is typically several times the Nyquist frequency of the analog input signal, i.e., the period $T_{CLK3}$ of the quantizer system clock is a fraction of the sampling period $T_S$. This mode of operation accounts for the term "over sampled" that is typically applied to Δ-Σ modulator systems of the type discussed herein.

The converter 100 includes a second clock generator for generating a clock signal CLK4 that is synchronized with the quantizer clock signal CLK3. The second clock signal CLK4 is coupled to the clock terminal CK of the counter 114 and clocks it at a predetermined rate that is a multiple of the frequency of the quantizer clock signal CLK3. Accordingly, the quantizer clock signal CLK3 is generated having a frequency that is a submultiple of the counter clock frequency and a multiple of the sampling frequency. Stated differently, the period $T_{CLK4}$ of the counter clock CLK4 is a submultiple of the period $T_{CLK3}$ of the quantizer clock signal CLK3, which is a submultiple of the sampling period $T_S$. The Δ-Σ A/D quantizer 110 of the invention is operated at a duty cycle below 50% to maintain constant pulse frequency. The normalized quantization error for the circuit 100 of the present invention, including an adjustment for the limited duty cycle range, is given by:

$$q = \frac{T_{CLK4}}{\sqrt{3T_PT_S}}.$$

The average pulse width $T_P$ can be set to a large value to minimize the quantization noise. In contrast to the prior art circuits, setting $T_P$ to a large value while maintaining a small value for $T_{CLK3}$ does not require implementation of a large shift register. According to the present invention, the maximum value of the average pulse width $T_P$ is only limited by the sample period $T_S$ or by practical resistor and capacitor sizes.

In operation, the analog signal $V_{IN}$ is being constantly compared in the op amp 118 to an input reference signal $V_{REF}$. The output of the op amp 118 strives to maintain a comparison between the analog input signal and the reference. The op amp output on line 132 is thus either charging or discharging the integrating capacitor 120. The output 132 of the integrating stage shown enclosed by broken line box 116 is shown as being connected to the non-inverting input of the comparator 126 whose inverting input is fed by the predetermined reference voltage $V_{REF}$, thus providing a threshold which must be exceeded before the comparator 126 switches state. The signal output by the comparator 126 is sampled by the flip-flop 128 which is controlled by the clock signal CLK3. The Q output 130 of the clocked flip-flop 128 is added to the feedback of the integrating capacitor 120 via operation of the electronic switch 124. The converted digital signal is thus fed back to the input of operational amplifier 118. The counter 114 operates at the rate of the counter's clock to measure the duty cycle over the sampling interval Ts and output the result to the processor 7.

Figure 8:
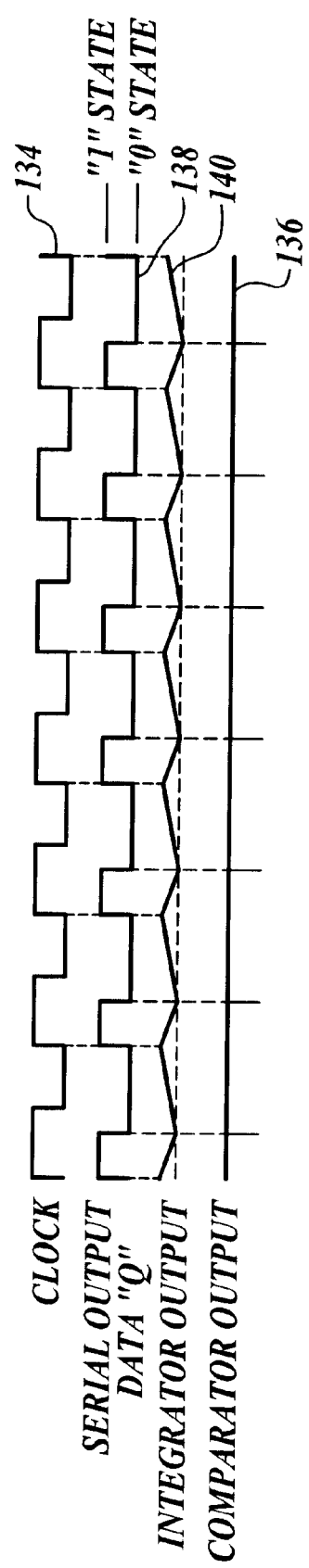
FIG. 8 illustrates waveforms produced by the Δ-Σ A/D quantizer circuit of the present invention when a DC analog signal is input to integrator circuit portion having a single clocked feed back signal to the integration phase, wherein a relatively low-frequency clock signal is applied to the D flip-flop circuit so that the timing of the rising edge of each pulse is controlled by a relatively low-frequency clock signal and the trailing edge of each pulse is controlled by the signal level.

FIG. 8 illustrates waveforms produced by the Δ-Σ A/D quantizer circuit of the invention when a DC analog signal is input to integrator circuit 116 and having a single clocked feed back to the integration phase, wherein the relatively low-frequency clock signal CLK3 is applied to the flip-flop 128 so that the timing of the rising edge of each pulse is controlled by a relatively low-frequency clock signal and the trailing edge of each pulse is controlled by the signal level. Digital signal waveform 134 represents the relatively low-frequency clock CLK3 having a period $T_{CLK3}$ that is a multiple of the sampling frequency $T_S$ and a submultiple of the period $T_{CLK4}$ of the counter clock CLK4. The clock CLK3 applied to the flip-flop 128 of FIG. 7 is a positive (rising-edge) sense clock, and the invention has been practiced with a rising-edge clock. Therefore, in FIG. 8 the pulse transitions of the serial output on line 138 are depicted as being synchronous with the rising edges of the clock signal CLK3 on line 134, rather than with the falling clock edges. Alternatively, the clock CLK3 is a negative (falling-edge) sense clock. Thus, synchronicity with the rising clock edges rather than the falling clock edges is an arbitrary choice. The Δ-Σ quantizer clock is shown as having a 50% duty cycle.

A second waveform 136 on the graph of FIG. 8 represents the output of the comparator 126 to the "R" input of the latch 128. As illustrated, in the steady state with a DC input the comparator output 136 goes LOW only momentarily in each cycle, to reset the flip-flop circuit 128.

Another waveform 138 represents the output of the latch 128 at node 130. The output of the latch switches between the "0" and "1" states in response to the output of the integrator 116. Triangular waveform 140 represents the integrator output which is slewing in a triangular waveform in response to the input to the integrator circuit 116 on line 132, the feedback of the capacitor 120 and the operation of the flip-flop circuit 128. The signal processor 7 reads the serial output data signal 138 for determining the digital form of the analog input signal.

As illustrated in FIG. 8, during the high output of the latch 128, the integrator 116 is discharging until such time that the latch 128 changes state to a LOW (0) and the integrator starts charging. As discussed above, as the analog input signal increases, the duration of time that the latch is at a "0" state also increases. When the input signal is at a maximum value, the output of the latch is maintained at a "0" state for the longest period. When the input signal is in the middle of its range, the output of the latch is in the "0" state and the HIGH (1) state an equal amount of time.

Thus, when the pulse width modulator is implemented according to the invention as one of the Δ-Σ modulators shown in FIG. 7, the input analog signal level, $V_{IN}$, is approximated by measuring the duty cycle over a sampling interval, $T_S$, where the sampling interval begins and ends on a clock transition (CLK). In other words, the counter 114 counts the number of highs and lows for the sample period $T_S$ to measure the duty cycle during a sample period.

While the preferred embodiment of the invention has been illustrated and described, it will be appreciated that various changes can be made therein without departing from the spirit and scope of the invention.

What is claimed is:

1. A delta-sigma modulation analog-to-digital converter for converting an analog input signal to a digital output signal, the analog-to-digital converter comprising:

first and second clock generator means for generating first and second clock signals at different frequencies, the frequency of the first clock signal being a submultiple of the frequency of the second clock signal;

delta-sigma modulation type quantization means for quantizing the analog input signal in response to the first clock signal; and counting means for counting a number of highs during a sample period in response to the second clock signal.

2. The analog-to-digital converter of claim 1 wherein the first clock signal is a multiple of a sampling frequency.

3. The analog-to-digital converter of claim 1 wherein the second clock signal is synchronized with the first clock signal.

4. The analog-to-digital converter of claim 1 wherein the quantization means produces a pulse train having a duty cycle that is proportional to the analog input signal level.

5. The analog-to-digital converter of claim 4 wherein the counter means includes means for measuring the duty cycle of the pulse train over the sample period.

6. The analog-to-digital converter of claim 1, further comprising a signal processor means for processing an output of the counter means.

7. A delta-sigma modulator for an analog-to-digital converter for converting an analog voltage signal to a digital output signal, comprising:
   an input for receiving the analog voltage signal;
   a first clock generator for generating a first clock signal at a first frequency;
   a pulse-width modulator-type quantizer that is responsive to the input analog voltage signal and to the first clock signal for producing a pulse train having a duty cycle that is proportional to the analog voltage signal level;
   a second clock generator for generating a second clock signal at a second frequency;
   a measuring mechanism that is responsive to the second clock signal for measuring the duty cycle of the pulse train over a sampling interval and outputting a density modulated serial digital data stream; and
   a signal processing stage for digitally processing the density modulated serial digital data and producing a digital output signal corresponding to the analog voltage signal.

8. The analog-to-digital converter of claim 7 wherein the pulse train output by the pulse-width modulator-type quantizer further comprises a plurality of pulses each having a rising edge and a trailing edge, timing of the rising edge of each pulse being controlled by the first clock signal and timing of the trailing edge of each pulse being controlled by the analog input signal level.

9. The analog-to-digital converter of claim 7 wherein the frequency of the first clock signal is selected to be a submultiple of the frequency of the second clock signal.

10. The analog-to-digital converter of claim 9 wherein the signal processing stage is responsive to a third clock signal for timing the sampling interval over which the measuring mechanism measures the duty cycle of the pulse train, the third clock signal being generated at a third frequency that is a submultiple of the frequency of the first clock signal.

11. The analog-to-digital converter of claim 7 wherein the measuring mechanism further comprises an asynchronous counter mechanism.

12. A delta-sigma modulator for an analog-to-digital converter, comprising:
   (a) a source of time varying analog signals;
   (b) a signal integrating circuit having an input terminal and an output terminal, the source of analog signals being coupled to the input terminal and producing at the output terminal a changing output signal proportional to the integral of the analog signals;
   (c) a clocked resettable D flip-flop circuit having a clock input terminal, a reset input terminal and an output terminal, the reset input terminal of the flip-flop circuit being connected to the output terminal of the signal integrating circuit, the flip-flop circuit being structured to change state as a function of a charge state of the integrating circuit;
   (d) a single feedback path coupling the output terminal of the flip-flop circuit to the input terminal of the integrating circuit;
   (e) a counter circuit having a clock input terminal, a signal input terminal and an output terminal, the signal input terminal of the counter circuit being connected to the output terminal of the flip-flop circuit for counting a quantity of state changes of the flip-flop circuit during a sampling period; and
   (f) means for applying a plurality of different regularly occurring clock pulses to each of the clock input terminals of the flip-flop circuit and the counter circuit, the clock pulse being applied to the counter circuit having a period that is a submultiple of a period of the clock pulse being applied to the flip-flop circuit, and the period of the clock pulse being applied to the flip-flop circuit being a submultiple of the sampling period.

13. The delta-sigma modulator of claim 12 wherein the signal integrating circuit further comprises a first-order signal integrating circuit.

14. The delta-sigma modulator of claim 12, further comprising a switch circuit having two reference input terminals, a control terminal coupled to receive the output terminal of the flip-flop circuit, and an output terminal, the switch circuit being structured such that the output terminal is connected to one of the input terminals based on the logic state of the control terminal.

15. The delta-sigma modulator of claim 12, further comprising a signal processor circuit having a signal input terminal and an output terminal, the signal input terminal of the signal processor circuit being connected to the output terminal of the counter circuit for sampling an output of the counter circuit at an end of each sample period.

16. A method for using an electronic circuit to convert an analog input signal to a digital output signal, the method comprising:
   (a) receiving an analog input signal a source of time varying analog signals;
   (b) with the electronic circuit, receiving first and second clock signals at different frequencies, the frequency of the first clock signal being a submultiple of the frequency of the second clock signal;
   (c) with the electronic circuit, in response to the first clock signal using a delta-sigma modulation type quantizer circuit for quantizing the analog input signal; and
   (d) with the electronic circuit, in response to the second clock signal, counting a number of highs occurring during a sample period.

17. The method of claim 16 wherein the first clock signal is a submultiple of the sampling period.

18. The method of claim 16, further comprising, with the electronic circuit, generating the first and second clock signals.

19. The method of claim 16, further comprising synchronizing the second clock signal with the first clock signal.

20. The method of claim 16 wherein quantizing the analog input signal further comprises producing a pulse train having a duty cycle that is proportional to the analog input signal level.

21. The method of claim 20 wherein counting a number of highs during a sample period further comprises measuring the duty cycle of the pulse train over the sample period.

22. The method of claim 16, further comprising, with the electronic circuit, outputting a signal representative of the number of highs counted during the sample period.

23. The method of claim 22, further comprising, with the electronic circuit, processing the signal representative of the number of highs counted during the sample period for converting the analog input signal to a digital output signal.

* * * * *